United States Patent [19]

Treise et al.

[11] Patent Number: 4,488,108
[45] Date of Patent: Dec. 11, 1984

[54] PHASE DETECTOR ERROR COMPENSATION APPARATUS

[75] Inventors: Jan E. Treise, West Melbourne; Harley W. Beningfield, Satellite Beach, both of Fla.

[73] Assignee: Rockwell International Corporation, El Sequndo, Calif.

[21] Appl. No.: 412,346

[22] Filed: Aug. 27, 1982

[51] Int. Cl.³ ............................................ G01R 25/00
[52] U.S. Cl. .............................. 324/83 D; 324/83 R; 328/133
[58] Field of Search ........... 324/73 R, 73 PC, 73 AT, 324/78 F, 78 ZX, 82, 83 D, 83 R, 84; 328/133, 134; 364/484

[56] References Cited

U.S. PATENT DOCUMENTS

| | | | | |
|---|---|---|---|---|
| 3,450,990 | 6/1969 | Green | | 324/82 |
| 4,037,161 | 7/1977 | Westell | | 328/133 |
| 4,119,926 | 10/1978 | Frosch | | 328/133 |
| 4,300,092 | 11/1981 | Strenglein | | 324/84 |
| 4,328,463 | 5/1982 | Avins | | 328/133 |

*Primary Examiner*—Stewart J. Levy
*Attorney, Agent, or Firm*—Bruce C. Lutz; Robert C. Mayes; H. Fredrick Hamann

[57] ABSTRACT

An approach to measuring the phase difference between two signals which automatically compensates for errors due to unequal DC offsets between the two channels of phase derived signal circuitry due to aging or temperature variations of components in these circuits by measuring the positive and negative half cycle time periods of the two signals whose phase is being compared as well as measuring the time difference between the same phase point on each of the two signals and combining this information in accordance with an algorithm set forth herein to obtain a phase measurement. The swapping of the signal paths on a periodic basis and averaging of the results is also used to eliminate errors due to signal processing variations in one of the signal paths as compared to the other signal path.

5 Claims, 4 Drawing Figures

PHASE DETECTOR ERROR COMPENSATION APPARATUS

THE INVENTION

The present invention is generally related to electronics and more specifically related to phase detection. Even more specifically, the present invention is related to phase detection of two signals which are processed in identically designed but different component constructed signal paths thereby typically causing differential phase shift between the signal paths or channels and unequal DC offsets.

BACKGROUND

VOR (Very High Frequency OMNI Ranging) ground stations transmit a signal to airplanes or other vehicles conveying magnetic bearing information from the station. This bearing information is conveyed as the phase difference between two 30 hertz modulation signal components. One of these components, the variable phase, is imposed upon the radio frequency carrier as amplitude modulation. The other component, the reference phase, is transmitted by frequency modulating a 9,960 hertz subcarrier at a 30 hertz rate and imposing the subcarrier upon the radio frequency carrier by amplitude modulation.

In a standard VOR receiver, an FM discriminator recovers the reference phase signal from the subcarrier. The recovered 30 hertz reference signal is passed through a bandpass filter, while another bandpass filter selects the 30 hertz variable phase signal which was imposed as amplitude modulation on the carrier. These two filters extract the reference and variable phase signals from noise and other modulation components. Bearing information from the ground station is then derived by measuring the phase difference between the two 30 hertz signals at the bandpass filter outputs.

The phase measurement may be accomplished by measuring the time interval between similar slope zero crossings of the two 30 hertz signals and dividing this time by the period of one of the signals. The quotient may be interpreted as a fraction of 360 degrees. Such a measurement is independent of signal frequency errors.

Conventional prior art circuits for making the VOR phase measurement require at least one initial service adjustment to correct differential phase shift between the two bandpass filters. Some prior art circuits employ an additional initial adjustment to correct for differential DC offset voltages between the two channels. Aging of components then typically requires further adjustments.

The typical method of making the phase measurement in the prior art involves squaring the leading and trailing edges of both 30 hertz sine-wave signals and making time measurements between the edges of the resultant rectangular waveforms. A DC offset voltage anywhere in the system results in an improper zero crossing detection with a resulting displacement in time of the edge of the rectangular waveform from the mathematical zero crossing of the original sine wave. If the offsets are not identical for the two channels, reference and variable, the resulting unequal time displacements will result in bearing error.

Component parameter drift due to aging or temperature variations further provides errors by altering both differential phase shift between the two channels and also DC offsets. The two alterations produce bearing errors. Conventional prior art circuits, therefore, must employ very stable components to maintain acceptable operational accuracy.

It is therefore an object of the present invention to provide a circuit which provides measurement of the phase without having a requirement for extremely stable components.

Another object of the present invention is to provide a circuit which accomplishes phase measurement while eliminating the requirement for service adjustments.

Other objects and advantages of the present invention may be ascertained from a reading of the specification and appended claims in conjunction with the drawings wherein:

FIG. 1 is a block diagram of one embodiment of the inventive concept;

FIG. 2 comprises a set of waveforms used in explaining the operation of FIG. 1;

FIG. 3 is a drawing showing in more detail an FM discriminator as used in FIG. 1; and FIG. 4 is a schematic diagram of a typical filter as used in FIG. 1.

DETAILED DESCRIPTION

Figure 1:
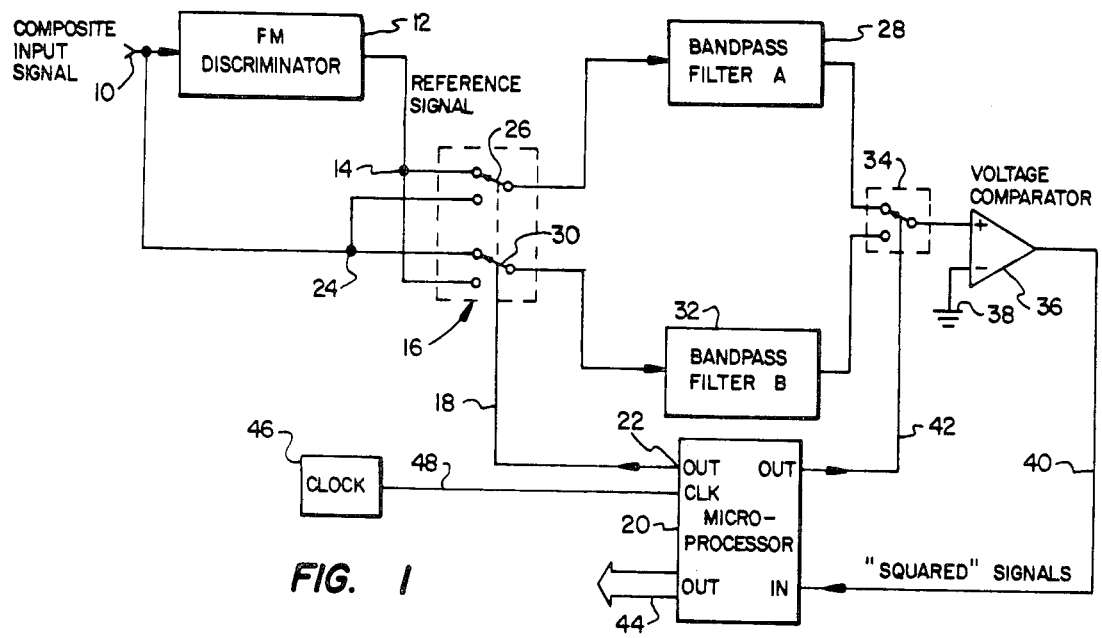

In FIG. 1 a composite input signal is supplied by input 10 to an FM discriminator 12 which has an output signal supplied as a reference signal to a junction point 14. Junction point 14 is connected to two terminals of a switch 16 shown as a pair of tandem operated switches, 26 and 30, controlled by signals received on lead 18 from a microprocessor 20 at an output terminal 22 thereof. The input 10 is also connected to a junction point 24 which is connected to another input of each of the two switches within block 16. The first switch 26 within block 16 has its output connected to a bandpass filter A designated 28 while the second switch 30 within switch block 16 is connected to the input of bandpass filter 32. The outputs of the two filters 28 and 32 are connected to inputs of a switch 34 which has its output connected to a positive input of a voltage comparator 36 having its other input connected to ground 38. Signals output from voltage comparator 36 are supplied via a signal lead 40 to an input terminal of microprocessor 20. A further output of processor 20 is supplied on a lead 42 to control the operation of analog switch 34. Informational output signals such as bearing are provided on a plurality of output leads labeled 44 from microprocessor 20. Clock signals are provided from a clock 46 on a lead 48 to a clock input of the microprocessor.

Figure 2:
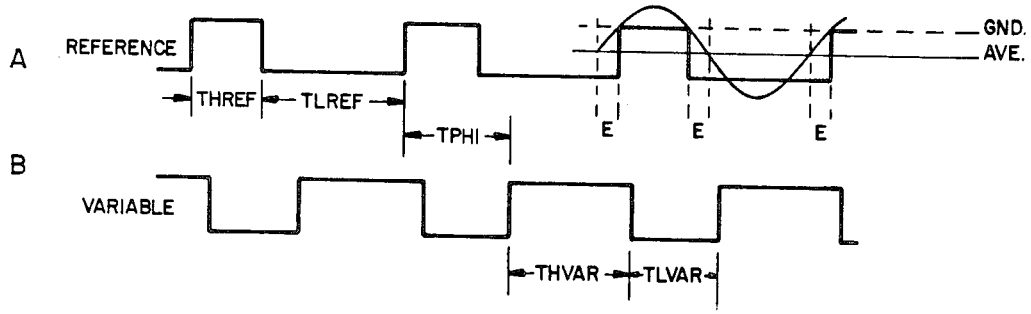

In FIG. 2 a first waveform A, which is the reference waveform, is shown having positive portions of the cycle labeled THREF and low voltage or negative portions labeled TLREF. The negative to positive going portion of waveform A is shown as commencing a time period labeled TPHI. This time period extends to the same negative to positive going portion of waveform B which is the variable phase signal. The positive half cycles or portions of the variable waveform are labeled THVAR while the negative portions are TLVAR. As may be determined, the designators shown are merely a way of designating the waveforms with the T being time, the H or L being high or low and the REF and VAR being reference or variable signals, respectively. The reference signal also shows, on the right-hand portion thereof, that it is derived from a sine-wave signal which has a true ground offset (in an exaggerated manner) from the signal average wherein the squaring of the signal causes the non-equal positive and negative portions of the rectangular waveform. The discrepancy in time between the actual and idealistic waveforms is labeled as E for error in timing information.

Figure 3:
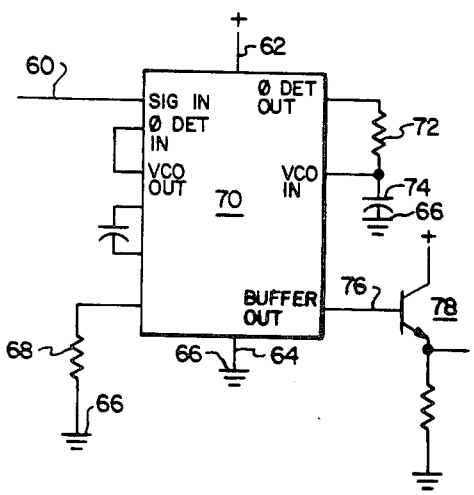

In FIG. 3 an FM discriminator chip is shown in more detail. One such chip would be a 4046 chip as may be obtained from National Semiconductor which has a SIGNAL IN lead 60 supplied to the chip, a positive power lead 62 and a lead 64 connected to ground 66. A resistor 68 is connected between one of the leads of the discriminator block 70 and ground 66. A resistor 72 is connected between the phase detector output and the VCO input. A capacitor 74 is connected between the VCO input and ground 66. Signals output from discriminator block 70 are supplied on a lead 76 to a transistor generally designated as 78 and output from the emitter lead of this transistor.

Figure 4:
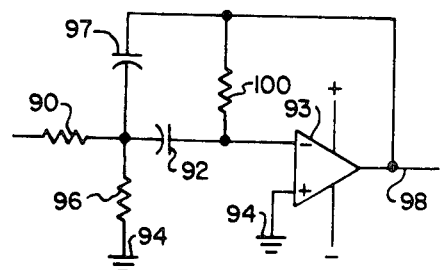

In FIG. 4 the bandpass filter used in one embodiment of the invention is shown in more detail with signals input through a resistor 90 and a capacitor 92 to a negative or inverting input of a differential amplifier having its other input connected to ground 94. Another resistor 96 is connected between the junction of resistor 90 and capacitor 92 to ground 94. A further capacitor 97 for feedback is connected between the same junction and an output of amplifier 93. The output of amplifier 93 is further labeled 98. Finally, a resistor 100 is connected between output 98 and the inverting input of amplifier 93.

OPERATION

The fundamental technique employed for eliminating the adverse effects of differential phase shift between channels such as bandpass filters 28 and 32 is to make a bearing measurement, then to reverse the signal between the two channels through the use of a device such as switch 16 and to make a second bearing measurement. Since the bearing error for the second measurement is equal in magnitude but opposite in sense to that of the first measurement, the average of the two measurements is the correct bearing, unaffected by the differential phase shifts.

Since an appreciable settling time is required for the phase of the output signals to stabilize after switching signals between filters, it would, in some implementations, be undesirable to switch signals after every measurement. It should be noted that the result of the two measurements with different channel assignments contain sufficient information with which to compute the differential phase shift existing at that time. This computed error may, then, be stored, and applied to subsequent measurements as a correction factor. In those situations in which settling delays before each measurement cannot be tolerated, the signals need to be interchanged between filters only as often as is necessary to maintain a reasonably current value of differential phase shift. This measurement technique eliminates the requirement for a service adjustment to correct for differential phase shift between channels. It also permits the use of less stable components than would be required in a conventional circuit.

If both the high and the low periods of a rectangular waveform derived by squaring a sine wave be measured, there is sufficient information to determine the time displacement of the rising and falling edges of the rectangular waveform from the mathematical zero crossing times of the original sine wave. The right-hand portion of FIG. 2A shows the error time E wherein a positive E indicates a rising edge late in time and, on the other hand, a negative E would indicate a rising edge early in time. This information is presented in Equations 1, 2 and 3 infra.

$$TL - 2E = TH + 2E \tag{1}$$

$$4E = TL - TH \tag{2}$$

$$E = (TL - TH)/4 \tag{3}$$

If the time displacements are known for both the reference and variable phase rectangular waveform edges, the error in bearing measurement may be computed and applied to the result as a correction factor. A more direct implementation of this technique is outlined by the Equations 4, 5 and 6 listed below using the terminology of FIGS. 2A and 2B.

$$EREF = \frac{TLREF - THREF}{4} \text{ positive} = \text{late (add } EREF \text{ to } TPHI) \tag{4}$$

$$EVAR = \frac{TLVAR - THVAR}{4} \text{ positive} = \text{late (subtract } EVAR \text{ from } TPHI) \tag{5}$$

$$PHASE = \frac{TPHI + EREF - EVAR}{THREF + TLREF} = \tag{6}$$

$$\frac{TPHI + \frac{1}{4}[TLREF - THREF - TLVAR + THVAR]}{THREF + TLREF}$$

The waveforms of FIG. 2A and FIG. 2B along with the Equations 1-6 show that the measurements of high and low periods of both waveforms, plus that of the interval between similar edges of two rectangular waveforms may be combined in one equation to produce a bearing measurement completely independent of differential DC offset between the two signal channels.

By combining these techniques for eliminating the effects of differential phase shifts and of unequal DC offsets between the two signal channels, it is possible to make bearing measurements free of errors due to the lack of precision of analog circuit elements.

It is possible to design a VOR receiver and a subcarrier FM discriminator shown as 12 in FIG. 1 with only small amounts of phase shift of the 30 hertz components. Further, these phase shifts can be made nearly independent of component aging effects and of the effects of varying temperature on components in the overall circuit. The resultant error may, then, be measured, and stored in the digital measurement and computation element of the circuit block 20, to be applied as an overall correction factor.

In the circuit of FIG. 1 a composite input signal is applied both to the FM discriminator 12 and to input leads of the switching device 16. In a first position of the switching device 16 the reference signal is applied to bandpass filter A while the composite input signals are applied to bandpass filter B. The voltage comparator 36 provides the filtered and squared signals on a time shared basis or in a time multiplexed manner to the input terminal of microprocessor 20. The microprocessor acts upon this information in a manner outlined below to provide BEARING or corrected phase CORPHASE output signals on leads 44 and to operate the switches 16 and 34 as necessary.

The operation of the apparatus of FIG. 1 can be described by using the three operation step sequences listed below.

EXECUTIVE SEQUENCE 1

LOOP: call subroutine MEASURE-ERROR
LOOP: call subroutine MEASUREPHASE set BEARING to ERROR+PHASE output BEARING
REPEAT for time T (approximately three minutes)
REPEAT
END The EXECUTIVE PSEUDOCODE SEQUENCE above has a first step of calling forth the MEASURE-ERROR SEQUENCE number 2 set forth below.

MEASURE-ERROR SEQUENCE 2 set "input analog switch control" line to apply reference 30 hertz signal to bandpass filter A, and variable 30 hertz signal to bandpass filter B
  pause approximately 250 milliseconds (allow filters to settle)
  set variable SUM=0
  LOOP: call subroutine MEASUREPHASE
  add PHASE to SUM
  REPEAT for total of eight measurements
  shift SUM right by three bit positions (divides by 8)
  store shifted SUM as RESULTA
  invert state of "input analog switch control" line
  pause approximately 250 milliseconds
  set variable SUM=0
  LOOP: call subroutine MEASUREPHASE
  add PHASE to SUM
  REPEAT for total of eight measurements
  shift SUM right by three bit positions (divides by 8)
  store shifted SUM as RESULTB
  subtract RESULTB from RESULTA
  divide difference by 2
  store quotient as ERROR (Note: may be positive, negative, or zero and replaces previous value)
  return
END The microprocessor 20 then sets switch 16 to supply the reference signals to bandpass filter A and the composite signal to bandpass filter B. The processor does not do anything for approximately 250 milliseconds to allow the filters to settle and sets a variable labeled SUM to zero. It then calls forth the subroutine MEASUREPHASE SEQUENCE 3 listed below.

MEASUREPHASE SEQUENCE 3 set "output analog switch control" line to apply reference 30 hertz signal to voltage comparator
  locate 0-to-1 transition at comparator output
  count time interval unit 1-to-0 transitions, and store measurement as THREF
  count time interval unit 0-to-1 transition, and store measurement as TLREF
  invert state of "output analog switch control" line
  count time interval unit 0-to-1 transition at comparator output, and store measurement as TPHI
  count time interval unit 1-to-0 transition, and store measurement as THVAR
  count time interval until 0-to-1 transition, and store measurement as TLVAR
  subtract THREF from TLREF
  subtract TLVAR from this difference
  add THVAR to this difference
  shift SUM right by two bits positions (divides by 4)
  add TPHI to shift SUM
  store result as NUMERATOR
  add THREF to TLREF
  store result as DENOMINATOR
  divide NUMERATOR by DENOMINATOR
  store quotient as PHASE
  return
END In the MEASUREPHASE subroutine the output analog switch 34 is set to apply the reference signal from filter A to the voltage comparator 36. The zero-to-1 transition at the comparator output is defined and the time interval is counted from the zero-to-1 transition to the 1-to-zero transition and this value is stored as measurement THREF. The next time interval, TLREF, is then stored, the state of the switch 34 is then altered and a time measurement of TPHI is then stored. The time interval for THVAR is measured and stored and finally a measurement TLVAR is completed and stored. The remaining elements of the MEASUREPHASE SEQUENCE are then accomplished so as to provide the phase measurement of Equation 6. At this time the microprocessor returns to the MEASURE-ERROR SEQUENCE number 2 and adds this PHASE value to the SUM. This operation is looped in one embodiment of the invention for eight measurement cycles. According to the next step of the MEASURE-ERROR SEQUENCE 2, the digital bits of the final value obtained within the SUM variable is shifted to the right by three bit positions to accomplish a division by eight so as to get an average value for the eight PHASE measurements. This value is stored as a variable called RESULTA. At this time the input analog switch 16 is inverted in state so as to average out the component differences within the bandpass filters 28 and 32. A pause of 250 milliseconds is again provided to allow the filters to settle and the SUM value is again set to zero. Again, a loop is provided to subroutine MEASUREPHASE SEQUENCE 3 for a total of eight times, the value is divided by eight and the quotient is stored as an average value RESULTB. In accordance with the last few steps of the MEASURE-ERROR SEQUENCE number 2, RESULTB is subtracted from RESULTA and the difference is divided by two so that an average error can be stored as an initial value or to replace the previous value.

At this time the microprocessor returns to the EXECUTIVE SEQUENCE 1 and calls forth the subroutine MEASUREPHASE. For approximately three minutes the apparatus repeats a loop of measuring the PHASE, setting the BEARING equal to the measured PHASE plus the ERROR found in the first portion of the EXECUTIVE SEQUENCE LOOP and outputting this summed as the actual BEARING. At approximately three minute intervals the referenced embodiment of the invention again computes the error value and uses this error value to adjust measured PHASE values for another three minutes. The value of three minutes was determined by empirical data to be accurate enough to completely compensate for any aging which might occur and other values which might change to affect the accuracy of the system.

In summary, the inventive concept incorporates the idea of measuring the phase difference with the input switch 16 in a first position, inverting the switch 16 to obtain a second PHASE measurement, averaging the difference in PHASE measurements to obtain an error signal and then taking the error signal as a compensation value for further PHASE measurements until it is time to recheck the error value.

While the values provided above were utilized in one specific embodiment of the inventive concept, we wish to be limited not by the specific embodiment illustrated and described but only by the scope of the appended claims wherein,

We claim:

1. The method of measuring PHASE comprising, the steps of:

measuring the positive half cycle reference signal time THREF;

measuring the negative half cycle reference signal time TLREF;

measuring the positive half cycle variable signal time THVAR;

measuring the negative half cycle variable signal time TLVAR;

measuring the displacement time TPHI between identical phase occurrences of said reference and variable phase signals; and calculating PHASE in accordance with:

$$PHASE = \frac{TPHI + \frac{1}{2}[TLREF - THREF - TLVAR + THVAR]}{THREF + TLREF}.$$

2. The method of measuring PHASE difference between a reference phase signal and a variable phase signal using a clock signal whose frequency is very high as compared to the frequency of the reference phase signal and a clock frequency signal counter comprising, the steps of:

counting the clock signal during the positive half cycle reference signal time to obtain a value THREF;

counting the clock signal during the negative half cycle reference signal time to obtain a value TLREF;

counting the clock signal during the positive half cycle variable signal time to obtain a value THVAR;

counting the clock signal during the negative half cycle variable signal time to obtain a value TLVAR;

counting the clock signal to obtain the displacement time value TPHI between identical phase occurrences of said reference and variable phase signals; and determining PHASE in accordance with:

$$PHASE = \frac{TPHI + \frac{1}{2}[TLREF - THREF - TLVAR + THVAR]}{THREF + TLREF}.$$

3. Apparatus for measuring PHASE difference (PHASE) between a reference phase signal and a variable phase signal using a clock signal whose frequency is very high as compared to the frequency of the reference phase signal and a clock frequency signal counter comprising, in combination:

first means for counting signals;

second means for supplying high frequency clock signals;

third means for supplying a reference phase signal;

fourth means for supplying a variable phase signal;

fifth means, connected to said first, second and third means for counting the clock signal during the positive half cycle reference signal time to obtain a value THREF;

sixth means, connected to said first, second and third means for counting the clock signal during the negative half cycle reference signal time to obtain a value TLREF;

seventh means, connected to said first, second and fourth means for counting the clock signal during the positive half cycle variable signal time to obtain a value THVAR;

eighth means, connected to said first, second and fourth means for counting the clock signal during the negative half cycle variable signal time to obtain a value TLVAR;

ninth means, connected to said first, second third and fourth means for counting the clock signal to obtain the displacement time value TPHI between identical phase occurrences of said reference and variable phase signals; and tenth means connected for receiving the counted values for determining PHASE in accordance with:

$$PHASE = \frac{TPHI + \frac{1}{2}[TLREF - THREF - TLVAR + THVAR]}{THREF + TLREF}.$$

4. The method of reducing signal processing differences of two theoretically identical electrical circuits supplying signals to be phase compared comprising, the steps of:

periodically measuring the phase difference PHASE1 between the signals supplied by said two electrical circuits;

interchanging the signal paths of the signals between the two circuits;

measuring the phase difference PHASE2 between the signals as received on the interchanged signal paths;

dividing the difference between the two phase measurements by two to obtain the average ERROR; and algebraically summing the ERROR to subsequent PHASE measurements to provide CORRECTED PHASE signals.

5. The method of eliminating phase measuring errors due to unequal DC offsets in signals supplied from substantially identical signal processing channels comprising, the steps of:

converting the incoming signals to be phase measured to rectangular waveform;

determining the time duration of the high (THREF) and low (TLREF) portions of the first signal determining the time duration of the high (THVAR) and low (TLVAR) portions of the second signal determining the time duration (TPHI) between identical phase occurrences of said first and second signals; and ascertaining the phase difference (PHASE) in accordance with:

$$PHASE = \frac{TPHI + \frac{1}{2}[TLREF - THREF - TLVAR + THVAR]}{THREF + TLREF}$$

* * * * *